(12) United States Patent
Li et al.

(10) Patent No.: US 7,471,142 B2
(45) Date of Patent: Dec. 30, 2008

(54) FILTER CALIBRATION WITH CELL RE-USE

(75) Inventors: Qiang (Tom) Li, Irvine, CA (US); Hooman Darabi, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 272 days.

(21) Appl. No.: 11/430,575

(22) Filed: May 9, 2006

(65) Prior Publication Data

US 2007/0262813 A1 Nov. 15, 2007

(51) Int. Cl.
   *H03B 1/00* (2006.01)
(52) U.S. Cl. .................................. 327/552; 327/553
(58) Field of Classification Search ......... 327/551–559, 327/513
   See application file for complete search history.

(56) References Cited

U.S. PATENT DOCUMENTS

| | | | | |
|---|---|---|---|---|
| 3,838,351 | A * | 9/1974 | Hekimian | 330/104 |
| 6,356,143 | B2 * | 3/2002 | Waltman | 327/557 |
| 6,552,618 | B2 * | 4/2003 | Nelson et al. | 331/11 |
| 6,584,422 | B2 * | 6/2003 | Bhaumik et al. | 702/107 |
| 7,078,961 | B2 * | 7/2006 | Punzenberger et al. | 327/553 |
| 7,174,144 | B2 * | 2/2007 | Lin | 455/258 |
| 7,259,633 | B2 * | 8/2007 | Lee et al. | 331/16 |
| 7,315,218 | B1 * | 1/2008 | Fernandez | 331/44 |

OTHER PUBLICATIONS

"KSU Single IC Bluetooth Receiver", *Block Diagram & Basic Operation*, 4.
"The BiQuad Section", 2.

* cited by examiner

*Primary Examiner*—Lincoln Donovan
*Assistant Examiner*—Hai L. Nguyen
(74) *Attorney, Agent, or Firm*—Brake Hughes Bellermann LLP; Shane Kennedy

(57) ABSTRACT

Various embodiments are disclosed relating filter calibration with cell re-use. According to an example embodiment, an apparatus includes a first circuit, including a variable circuit element. The first circuit is adapted to output an output frequency signal during a calibration mode and to operate as a filter during a filter mode. A control circuit is coupled to the first circuit and is adapted to receive a reference frequency signal and to calibrate the first circuit by adjusting the variable circuit element based on the reference frequency signal and the output frequency signal during the calibration mode. The calibrated first circuit is configured to then operate as a filter during the filter mode.

18 Claims, 5 Drawing Sheets

US 7,471,142 B2

FILTER CALIBRATION WITH CELL RE-USE

BACKGROUND

Filters are used in a wide variety of communications circuits and applications, such as receivers, transmitters, phase-locked loops, etc. Various filters may be provided using different circuit elements including resistors, capacitors, inductors, and other elements. One example filter is a transconductor-capacitor (Gm-C) filter, which may use a combination of transconductors (Gm), capacitors (C) and resistors (R), etc. In some cases, Gm-C filters may provide lower noise and lower-power operation than some other types of filters, but may require more power in some cases. Gm-C filters may also tend to have poorly controlled passband frequency response. For example, the corner frequency and bandwidth of a Gm-C filter may vary widely due to variation of Gm and C values as semiconductor process (P), supply voltage (V) and temperature (T) vary. In addition, calibration is sometimes performed on circuits to adjust the circuits to changing conditions.

SUMMARY

Various embodiments are disclosed relating to filters and calibration, and also relating to filter calibration with cell re-use.

According to an example embodiment, an apparatus includes a first circuit, including a variable circuit element. The first circuit is adapted to output an output frequency signal during a calibration mode and to operate as a filter during a filter mode. A control circuit is coupled to the first circuit and is adapted to receive a reference frequency signal and to calibrate the first circuit by adjusting the variable circuit element based on the reference frequency signal and the output frequency signal during the calibration mode. The calibrated first circuit may then be configured and operated as a filter during the filter mode.

According to another example embodiment, an apparatus is provided that includes a transconductor-capacitor (Gm-C) circuit adapted to operate as a capacitor controlled oscillator in a calibration mode and as a filter in a filter mode. The apparatus also includes a control circuit adapted to receive an output frequency signal from the Gm-C circuit during the calibration mode and a reference frequency signal. The control circuit is adapted or configured to calibrate the Gm-C circuit in the calibration mode by adjusting a transconductor or capacitor of the Gm-C circuit based on the output frequency signal and the reference frequency signal. The calibrated Gm-C circuit is then adapted or configured to operate as a filter in the filter mode.

DETAILED DESCRIPTION

Figure 1:
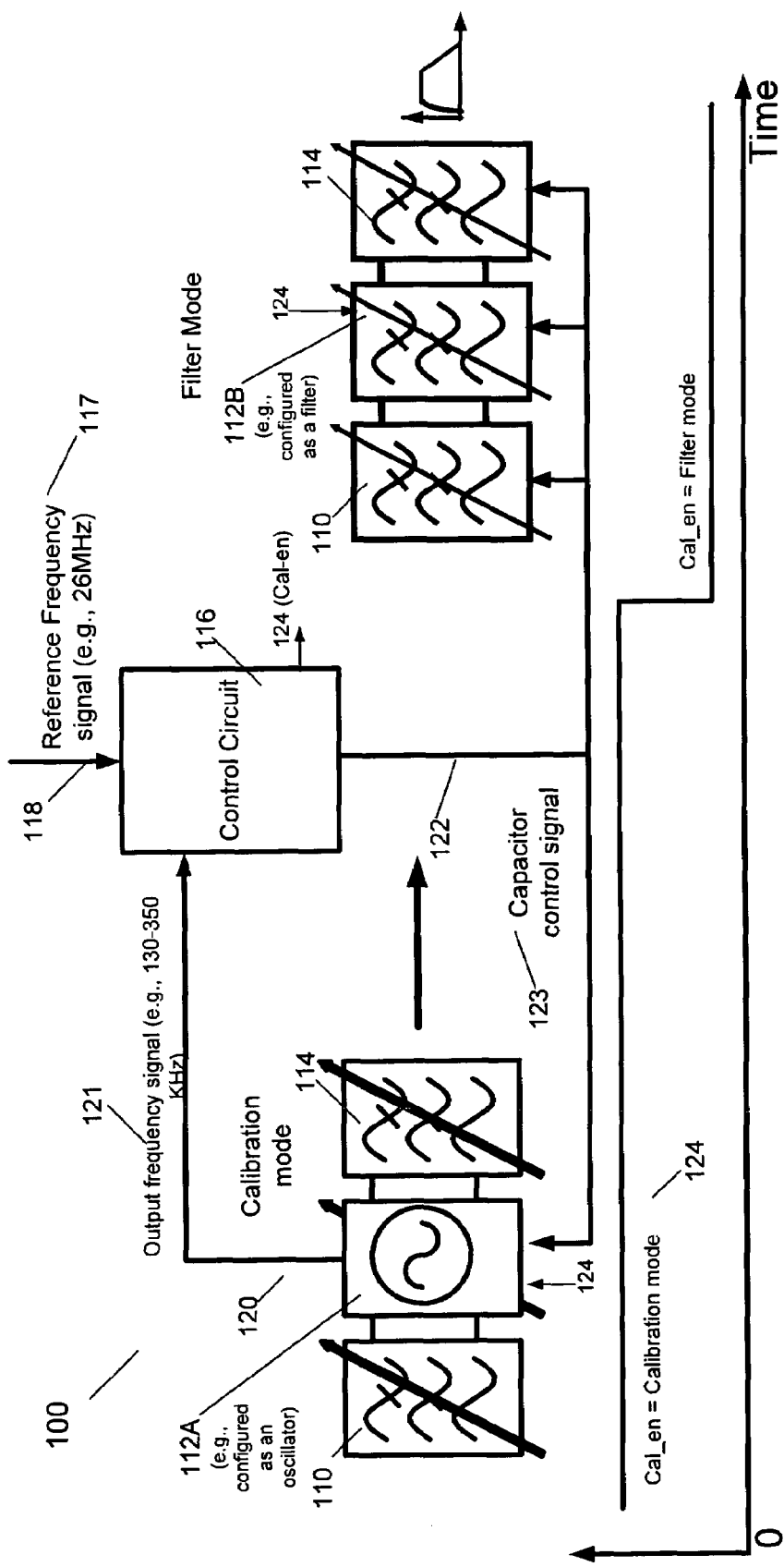
FIG. 1 is a block diagram of a circuit according to an example embodiment.

FIG. 1 is a block diagram of a circuit 100 according to an example embodiment. Circuit 100 may include a filter 110, a circuit 112 and a filter 114. According to an example embodiment, filter 110, circuit 121 and filter 114 may be transconductor-capacitor (Gm-C) circuits. This is merely an example, and other types of circuits may be used such as circuits that may use a variety of circuit elements, such as resistor, capacitors, inductors or other types of circuit elements.

According to an example embodiment, circuit 112 may be configured to operate as either an oscillator (circuit 112A) or a filter (circuit 112B), e.g., through a variation or adjustment of one or more circuit elements. For example, a switch between either a positive resistor or a negative resistor on the output of circuit 112 may configure the circuit 112 as either an oscillator or a filter, for example. For example, a negative resistor may be used on an output of the circuit 112 to configure the circuit 112 as an oscillator (circuit 112A) during a calibration mode, and a positive resistor on the output of circuit 112 may be used to configure circuit 112 as a filter (circuit 112B) during a filter mode, for example. Other variations may be used as well. However, according to an example embodiment, circuits 112A and 112B may use the same transconductors (Gm) and capacitors (C).

In an example embodiment, filter 110 may operate in a relatively low frequency range, circuit 112B (as a filter) may operate in a medium frequency range, and filter 114 may operate in a higher frequency range. In an example embodiment, each of circuits 110, 112, and 114 may be bi-quadratic circuits or biquads, which may be 2-pole, 2-zero filters, for example, although the embodiments described herein are not limited thereto. This is merely an example, and circuits 110, 112 and 114 may be other types of circuits.

As noted above, the corner frequency and bandwidth of a Gm-C filter, such as circuit 112B, may vary widely due to variation of Gm and C values as semiconductor process (P), supply voltage (V) and temperature (T) change (P, V or T). According to an example embodiment, the corner frequency of the filter 112B may be proportional to Gm/C. Similarly, the frequency output by circuit 112A as an oscillator may typically be proportional to Gm/C as well. Thus, if the oscillator output frequency from circuit 112A (oscillator) is calibrated by adjusting Gm and/or C to compensate for variations in process, voltage or temperature (P, V or T) (for example), this may also typically calibrate the corner frequency for circuit 112B (filter), since circuits 112A and 112B may typically employ the same transconductor(s) (Gm) and capacitor(s) (C).

However, an advantage of using circuit 112A, configured as an oscillator, to perform calibration is that circuit 112A as an oscillator outputs an output frequency (e.g., proportional to Gm/C), which may be received and compared to a reference frequency to determine the amount that Gm and/or C values in circuit 112 have changed due to variations in P, V or T, for example. This change in Gm and/or C, e.g., caused by variations in P, V or T, may then be compensated for by adjusting the values of Gm and/or C in circuit 112. In this manner, by calibrating circuit 112 while configured as an oscillator, this Gm/C adjustment to the oscillator circuit (circuit 112A) may also calibrate the corner frequency and/or bandwidth of the circuit 112 when configured as a filter so that the circuit 112B (configured as a filter) may operate at the designed operating point (e.g., designed corner frequency and bandwidth), despite variations in P, V and/or T.

Referring to FIG. 1, a control circuit 116 may control the calibration of circuit 112. During a calibration mode, control circuit 116 may output a calibration enable signal (Cal-en) 124 via line 122 to circuit 112. When the calibration enable signal 124 is high indicating calibration mode, circuit 112 configures itself (or is configured by control circuit 116 for example) as an oscillator, e.g., by turning on and off one or more switches to switch in a negative resistance on an output of circuit 112, for example. During calibration mode, control circuit 116 may receive an output frequency signal 121 via line 120, which may be, for example, the oscillation frequency of circuit 112A when configured as an oscillator. The oscillation frequency of circuit 112A may be proportional to Gm/C, an thus, the frequency of the output frequency signal 121 may indicate changes in Gm and/or C within circuit 112 due to variations in P, V or T, for example.

According to an example embodiment, control circuit 116 may receive a reference frequency signal 117 via line 118, such as a 26 MHz frequency signal from a crystal oscillator or other constant (or substantially constant) frequency source. In an example embodiment, the frequency of the reference frequency signal 117 does not typically vary due to changes in P, V or T, but rather may be substantially constant. According to an example embodiment, control circuit 116 may calibrate circuit 112 based on the output frequency signal 121 from circuit 112A and the reference frequency signal 117.

In an example embodiment, circuit 112 may include one or more variable circuit elements, such as a variable transconductor (Gm), a variable capacitor (C), or other variable circuit element. According to an example embodiment, control circuit 116 may calibrate circuit 112A by adjusting the variable circuit element within circuit 112A based on the reference frequency signal 117 and the output frequency signal 121 from circuit 112A.

In one example embodiment, circuit 112 (including circuits 112A and 112B) may include one or more variable capacitors (C), and control circuit 116 may adjust the variable capacitor of circuit 112 based on the output frequency signal 121 and the reference frequency signal 117. For example, circuit 112A may have been specifically designed to operate and generate an oscillation frequency of 240 KHz. However, due to a change or variation in P, V or T, the output frequency signal 121 is now at a frequency of 200 KHz. Therefore, control circuit 116 may compare the 200 KHz signal to the reference frequency signal 117 and determine that an error of −40 KHz is present in the output frequency signal 121. Control circuit 116 may then adjust the variable circuit element of circuit 112A so as to increase the frequency (oscillation frequency) of output frequency signal 121 of circuit 112A. Again the new output frequency signal 121, which may be now at 220 KHz, for example, is compared to the reference frequency signal 117 and control circuit 116 may determine that a frequency error of −20KHz exists. This process may be performed iteratively until circuit 112A (configured as an oscillator) outputs an output frequency signal 121 at a substantially desired frequency, e.g., iteratively to adjust the variable circuit element until the output frequency signal 121 becomes substantially equal to a predetermined frequency. In this manner, control circuit 116 may calibrate circuit 112A for current P, V and T, for example.

According to an example embodiment, circuit 112 may include one or more variable capacitors (C), and control circuit 116 may calibrate circuit 112A by adjusting the variable capacitor of circuit 112. In such a case, the circuit 112A, configured as an oscillator, may be referred to as a capacitor controlled oscillator (CCO) because the oscillation frequency (frequency of output frequency signal 121) of circuit 112A may be varied by adjusting the variable capacitor of circuit 112. While the transconductor (Gm) of circuit 112 may instead be adjusted by control circuit 116 to cause circuit 112A to generate the desired output frequency signal 121, adjusting the capacitor may provide improved linearity as compared to adjusting the Gm.

In an example embodiment, control circuit 116 may adjust the variable capacitor of circuit 112A by outputting a digital capacitor control signal 123 via line 122. The variable capacitor of circuit 112A may include one or more switched capacitors, as an example. For example, capacitor control signal 123 may be a 4-bit signal between 0000 and 1111, and may control the switches of the capacitor to control the capacitance value of the variable capacitor of circuit 112A. For example, each iteration in the calibration of receiving the output frequency signal 121 and determining an error, may include providing an updated value for capacitor control signal 123 so as to adjust the frequency of the output frequency signal 121 to the desired frequency.

Once the circuit 112A has been calibrated, control circuit 116 may change the calibration enable signal (Cal_en) 124 to a zero, indicating filter mode. As noted above, both the oscillation frequency of circuit 112A (oscillator) and the corner frequency of circuit 112B (filter) may be proportional to Gm/C of the circuit. Therefore, according to an example embodiment, an adjustment (or calibration) of the variable circuit element, either Gm and/or C of circuit 112A in calibration mode may provide a substantially appropriate adjustment in Gm and/or C to provide the desired corner frequency and bandwidth of circuit 112B in filter mode, since circuits 112A and 112B may typically use the same transconductors (Gm) and capacitors (C).

The calibration mode for circuits 110, 112 and 114 is shown on the left side of FIG. 1, while the filter mode for circuits 110, 112 and 114 is shown on the right side of FIG. 1. In an example embodiment, the circuit 112 may be substantially the same circuit for both modes, with the exception that the circuit 112 may be configured as an oscillator (circuit 112A) during calibration mode and configured as a filter (circuit 112B) during filter mode, e.g., via a change in output resistor value using one or more switches, for example. In response to the calibration signal 124 indicating filter mode, circuit 112 may configure itself (or, for example, may be configured by control circuit 116) as a filter, e.g., by adjusting an output resistor of circuit 112 from a negative resistor to a positive resistor value. In an example embodiment, such a change in output resistor, to change between an oscillator (112A) and a filter (112B), does not affect the Gm or C values of circuit 112 that are being calibrated, and thus, does not affect the calibrated corner frequency and bandwidth of the circuit 112B as a filter. After circuit 112 has been calibrated by control circuit 116, circuit 112 may then be configured and operated as a filter.

In an example embodiment, filter 110 and filter 114 are the same filters in both modes, and each may also include a variable circuit element, such as a variable capacitor or variable transconductor. In one example embodiment, filter 110 and 114 may include a variable capacitor. As noted above, in an example embodiment, filter 110 may operate in a relatively low frequency range, circuit 112B (as a filter) may operate in a medium frequency range, and filter 114 may operate in a higher frequency range, although this is merely an example. Circuit 112 may be chosen for calibration since it may provide an estimate for adjusting circuit elements of filters 110 and 114, as circuit operates in a range between the frequency ranges for filters 110 and 114 (in the event that only one of the circuits will be calibrated). Therefore, the capacitor control signal 123 provided by control circuit 116 to calibrate circuit 112 may also be provided to filters 110 and 114. In other words, the digital capacitor control signal 123 (e.g.,1011) used by control circuit to adjust capacitors to calibrate circuit 112 may also be provided to adjust capacitors of filters 110 and 114. In this example embodiment, filters 110 and 114 are not actually calibrated as such. Rather, variable circuit elements in filters 110 and 114 may be adjusted based on the calibration of circuit 112, e.g., the same capacitor control value determined by calibrating circuit 112, may be used to adjust circuit elements for filters 110 and 114 as well. This is because, in an example embodiment, the variation in Gm and C experienced by filters 110 and 114 may substantially similar or even substantially the same in some cases, as the variation in Gm and C of circuit 112 due to changes in P, V or T. Thus, the calibration of circuit 112 may provide an estimated adjustment for filters 110 and 114 without having to actually calibrate filters 110 and 114.

In an alternative embodiment, although not shown in FIG. 1, each of circuits 110, 112 and 114 may be configurable as either an oscillator or a filter. Also, each of circuits 110, 112 and 114 may each be separately (independently) calibrated by control circuit 116. Thus, in this example embodiment, circuits 110, 112, and 114 may be configured as oscillators. Control circuit 116 may then independently calibrate circuits 110, 112 and 114, e.g., by determining capacitor control signals that adjust the output frequency of each circuit to a determined frequency. A different or independent capacitor control signal may thus be determined and provided for each circuit 110, 112 and 114. This alternative embodiment may provide improved performance (e.g., more exact adjustment of corner frequencies for circuits 110 and 114) at the expense of additional processing overhead by control circuit 116, as compared to the embodiment described with reference to FIG. 1 where only circuit 112 is actually calibrated.

Thus, according to an example embodiment, a circuit (e.g., 112) used for calibration may be re-used as a filter. As compared to using a separate calibration circuit, the technique of re-using the calibration circuit as a filter, or using a filter as also a calibration circuit may offer one or more advantages in some embodiments, such as: filter (e.g., 112B) may be programmed by calibrating the oscillator (e.g., 112A) via digital control signal; mismatch may be reduced due to cell or circuit re-use (e.g., using separate circuits for calibration, 112A, and for filter, 112B may introduce error in calibration due to mismatch, and re-using the same circuit for both calibration and filter may reduce the potential mismatch); cell or circuit re-use may typically reduce die size since fewer circuits may be required; there may be little impact on filter linearity if capacitor is adjusted or tuned instead of Gm, in an example embodiment; and calibration is not substantially impacted by switching an output resistor between circuits 112A and 112B because Gm and C are the components being calibrated, for example.

Figure 2:
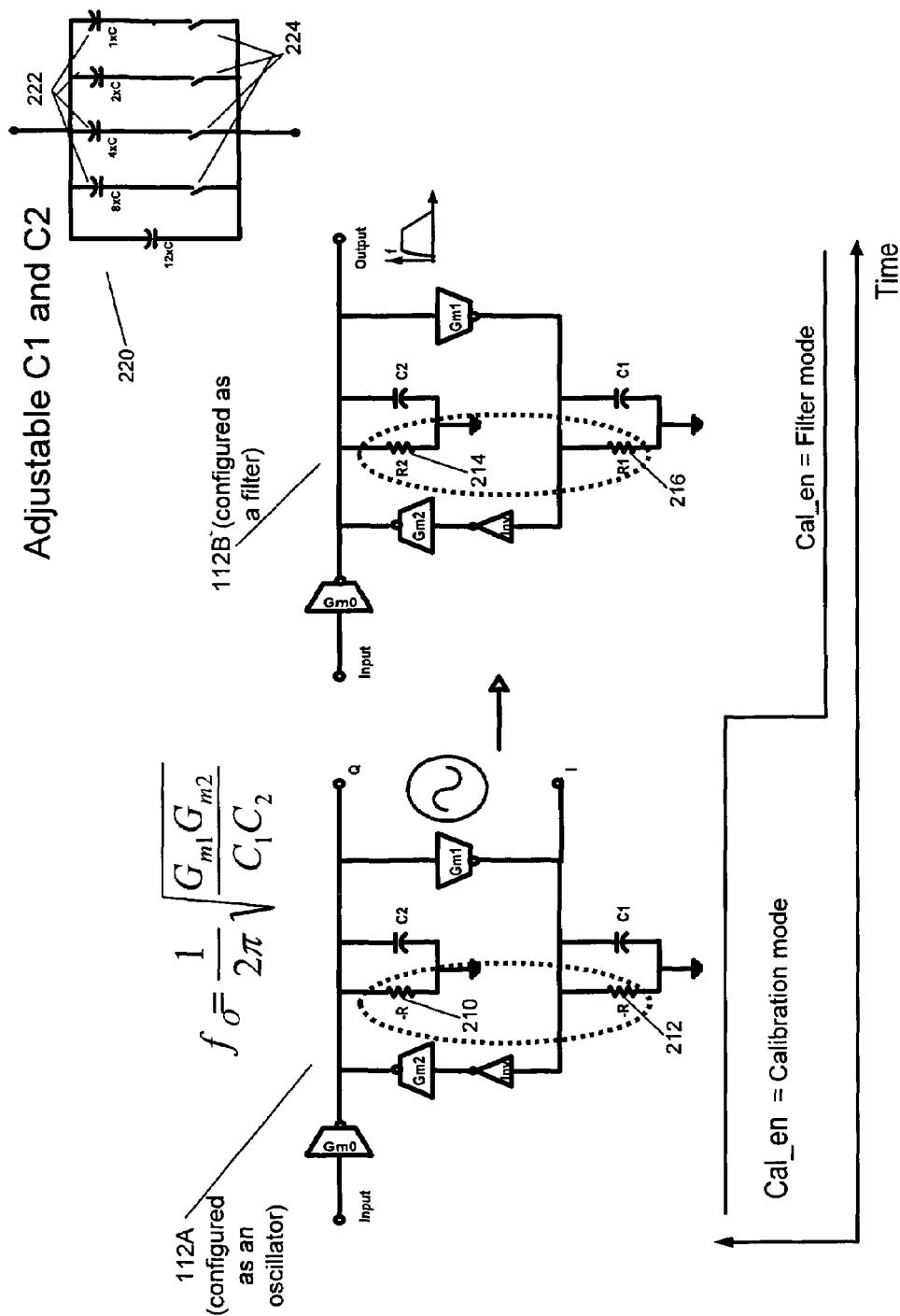
FIG. 2 is a diagram illustrating a circuit according to an example embodiment.

FIG. 2 is a diagram illustrating a circuit according to an example embodiment. Circuit 112A, configured as an oscillator, is shown on the left, and circuit 112B, configured as a filter is shown on the right. An equation is provided for the oscillation frequency ($f_o$) for circuit 112 A. Circuit 112A includes a Gm0 on the input, a Gm2, an inverter, a Gm1, and capacitors C1 and C2. C1 and C2 are variable capacitors, and may be switched capacitors, for example. As shown in the upper right, capacitors C1 and/or C2 may be switched capacitors, including, for example, a capacitor 220 may include a number of capacitors 222 and switches 224. Switches 224 may, for example, be opened or closed based on the value or bits of the capacitor control signal 123. In this manner, the value of capacitors C1 and/or C2 may be adjusted. In addition, two negative resistors are provided in circuit 112A, including resistor 210 and resistor 212, which allows circuit 112A to operate as an oscillator and generate an output frequency at the oscillation frequency ($f_o$), for example. Circuit 112B, configured as a filter, may include the same circuit elements as circuit 112A, except negative resistors 210 and 212 are switched out, and positive resistors 214 and 216 are switched in to allow circuit 112B to operate as a filter (e.g., using switches not shown).

Figure 3:
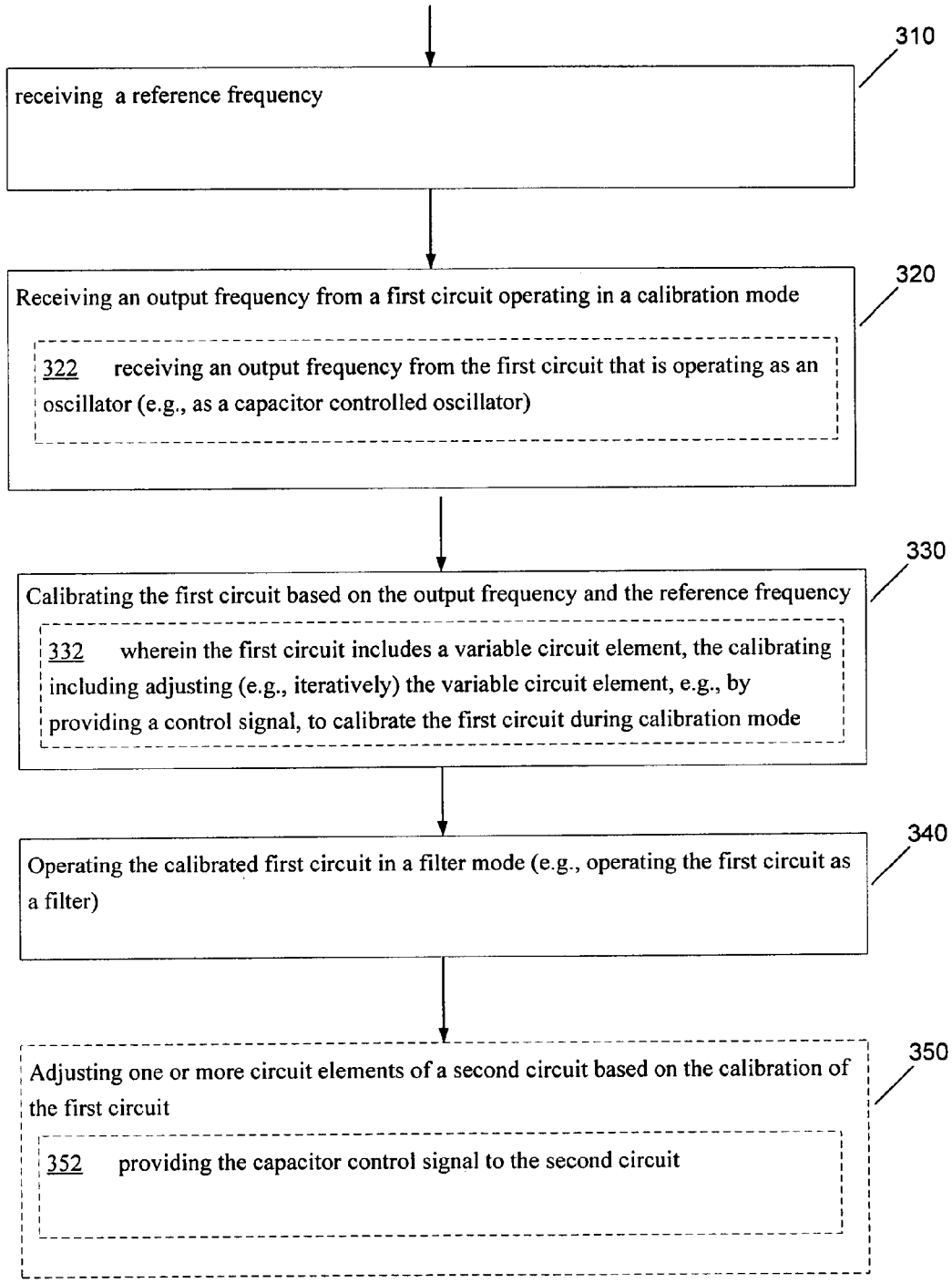
FIG. 3 is a flow chart illustrating operation according to an example embodiment.

FIG. 3 is a flow chart illustrating operation according to an example embodiment. At 310, a reference frequency is received. At 320, an output frequency signal is received from a first circuit operating in a calibration mode. For example, operation 320 may include receiving an output frequency signal from the first circuit that is operating as an oscillator (such as a capacitor controlled oscillator), operation 322. At 330, the first circuit may be calibrated based on the output frequency signal and the reference frequency signal. Operation 330 may include for example, adjusting (e.g., iteratively adjusting) a variable circuit element of the first circuit, e.g., by providing a control signal to calibrate the first circuit during calibration mode, operation 332. At 340, the calibrated first circuit may be operated in a filter mode (e.g., the first circuit may be operated as a filter), e.g., by adjusting a circuit parameter of the first circuit. At 350, one or more circuit elements of a second circuit may be adjusted based on the calibration of the first circuit. For example, operation 350 may include providing the capacitor control signal used for the first circuit (e.g., circuit 112) to the second circuit (e.g., circuit 110 or circuit 114).

Figure 4:
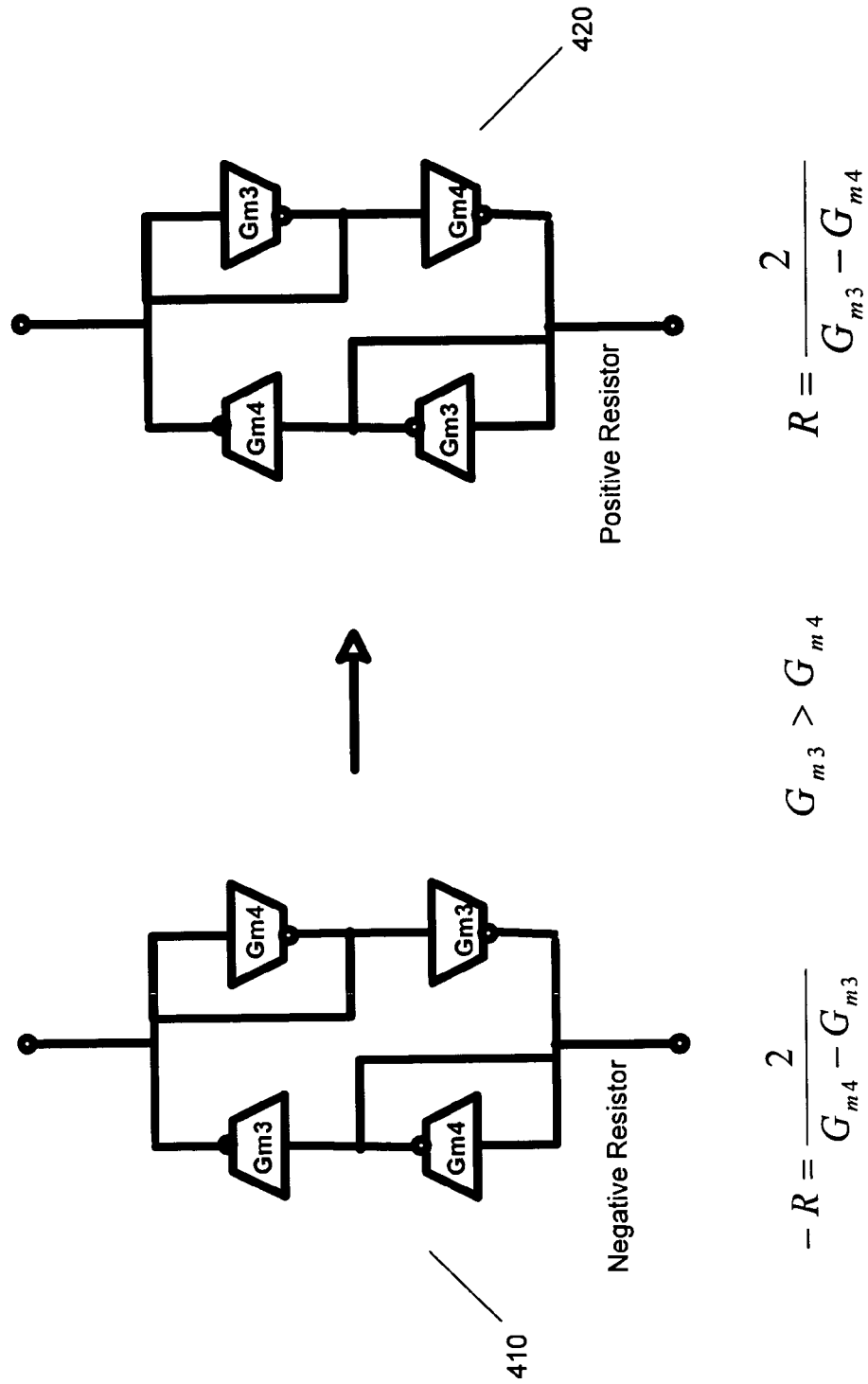
FIG. 4 is a diagram illustrating a resistor that may be converted between a positive resistor and a negative resistor, according to an example embodiment.

FIG. 4 is a diagram of a resistor that may be converted or switched between a positive resistor and a negative resistor, according to an example embodiment. Negative resistor 410 may be converted to a positive resistor 420, and vice versa, based on changing a configuration of one or more switches (not shown), according to an example embodiment. The resistor, shown as negative resistor 410 and positive resistor 420, may include a plurality of transconductors. For example, negative resistor 410 may include two transconductors $G_{m3}$ and two additional transconductors $G_{m4}$ connected as shown in FIG. 4. The two $G_{m3}$ transconductors may have the same transconductance value or gain, while the two $G_{m4}$ transconductors may have a same transconductance or gain. The negative resistance of resistor 410 may be determined or calculated as:

$$-R = \frac{2}{G_{m4} - G_{m3}}$$

In an example embodiment, one or more switches, for example, may be opened or closed to reconfigure the interconnection of the four transconductors, in order to convert between a negative resistor 410 and a positive resistor 420. This is merely one example technique and others may be used. In an example embodiment, the positive resistor 420 may use the same four transconductors as negative resistor 410, but these transconductors may typically be interconnected in a different manner as shown. The positive resistance of resistor 420 may be calculated as:

$$R = \frac{2}{G_{m3} - G_{m4}}$$

While FIG. 4 illustrates one example circuit to provide a switchable resistor, between positive and negative resistance values, other circuits or techniques may be used to provide such a switchable resistor.

Figure 5:
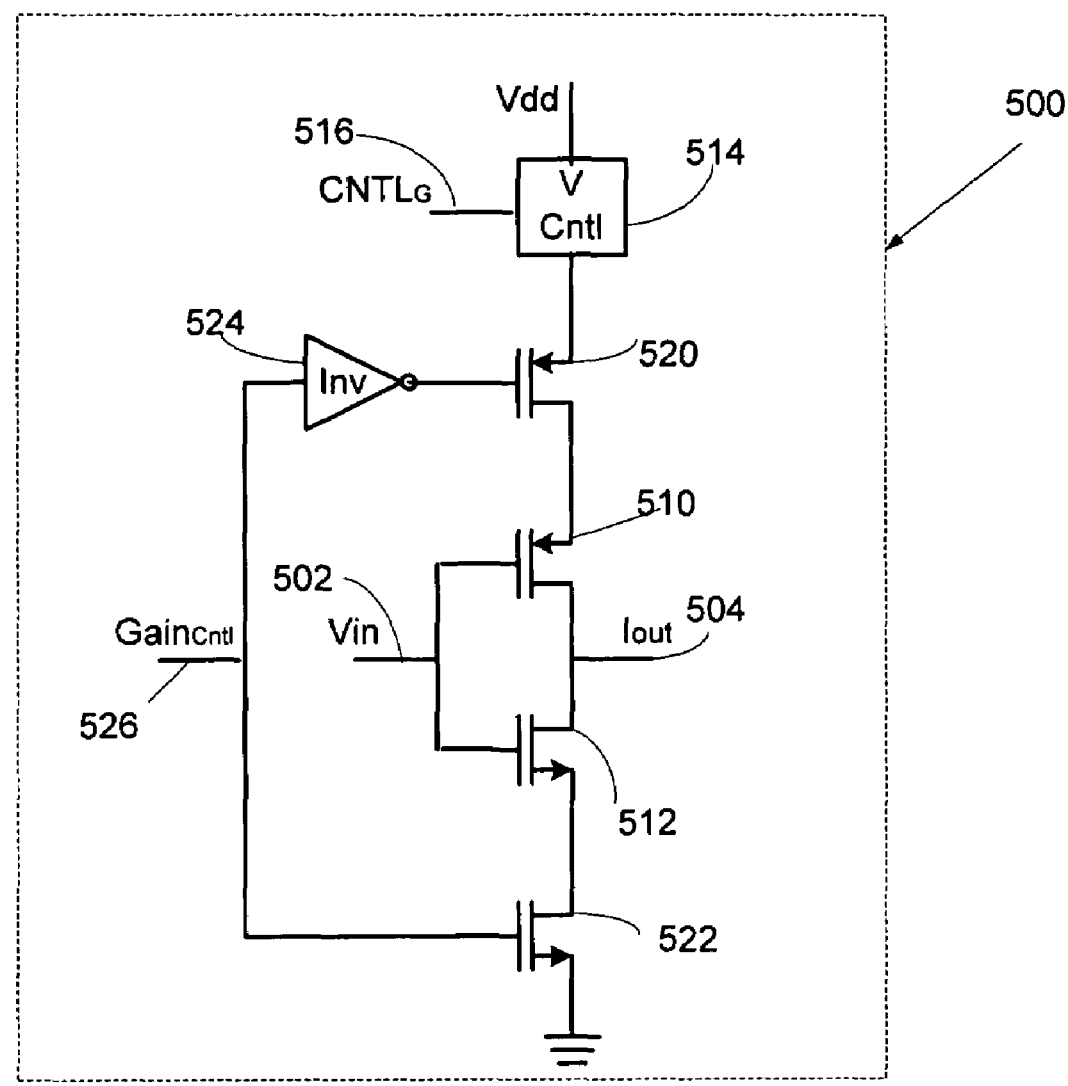
FIG. 5 is a schematic diagram illustrating a transconductor according to an example embodiment.

FIG. 5 is a schematic block diagram of a transconductor according to an example embodiment. The core of the transconductor 500 is formed by the transistors 510 and 512 together with a Vdd source 514 and a control input 516 to the Vdd source 514. As the input 502 to the gates of the transistors 510 and 512 is varied, the current from the Vdd source 514 is steered to the outputs of the transistors 510 and 512 in proportion to the input voltage at the gates. The $CTRL_g$ input 516 to the Vdd source 514 varies the total available supply voltage to the transconductor 500 and hence can continuously vary the Gm value of the amplifier 500 over a relatively narrow range (since Gm is proportional to Vdd). Stepwise switching of the gain of the transconductor 500 may be implemented through transistors 520 and 522 and inverter 524. When a logic level control signal $Gain_{cntl}$ 526 is activated, the conductance of transistors 520 and 522 is changed. When transistors 520 and 522 are in a high conductivity (or ON) state current flows through the transconductor transistors 510 and 512, and no current flows through the transconductor transistors 510 and 512 when transistors 520 and 522 are in a low conductivity (or OFF) state. The pair of transistors 520 and 522 ensures that both of the amplifier transistors 510 and 512 are on and off simultaneously since common mode voltage will be there all the time even when the transconductor is in an OFF state. The addition of transistors 520 and 522 allows large, stepwise, gain changes to be made to the transconductor by switching the logic level control signal $Gain_{cntl}$ 526 between a low and high signal level.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:
   a first circuit including a variable circuit element, the first circuit adapted to output an output frequency signal during a calibration mode and to operate as a filter during a filter mode;
   a control circuit coupled to the first circuit, the control circuit adapted to receive a reference frequency signal and to calibrate the first circuit by adjusting the variable circuit element based on the reference frequency signal and the output frequency signal during the calibration mode, the calibrated first circuit adapted to then operate as a filter during the filter mode.

2. The apparatus of claim 1 wherein the first circuit comprises a biquad circuit operable as either an oscillator in the calibration mode or as a filter in the filter mode.

3. The apparatus of claim 1 wherein the variable circuit element is a variable capacitor.

4. The apparatus of claim 1 wherein the first circuit comprises a transconductor-capacitor (Gm-C) circuit.

5. The apparatus of claim 1 wherein the control circuit is adapted to iteratively adjust the variable circuit element based on the output frequency signal and the reference frequency signal until the first circuit is calibrated.

6. The apparatus of claim 1 wherein the first circuit comprises a circuit adapted to operate as an oscillator during the calibration mode and to operate as a filter during a filter mode, the adjusted variable circuit element being used in the first circuit in both the calibration mode and the filter mode such that calibration of the first circuit in the calibration mode also operates to provide calibration for the first circuit in the filter mode.

7. The apparatus of claim 1 and further comprising a second circuit operable as a filter, wherein the calibration of the first circuit is used to calibrate the second circuit.

8. The apparatus of claim 1 wherein the variable circuit element is a variable capacitor, wherein the control circuit is adapted to adjust the variable capacitor by providing a digital capacitor control signal to calibrate the first circuit during the calibration mode.

9. The apparatus of claim 8 wherein the apparatus comprises a second circuit operable as a filter and having a variable capacitor, the digital capacitor control signal used to calibrate the first circuit being provided to the second circuit to adjust the variable capacitor of the second circuit based on the calibration of the first circuit.

10. A method comprising:
    receiving a reference frequency signal;
    receiving an output frequency signal from a first circuit operating in a calibration mode;
    calibrating the first circuit based on the output frequency signal and the reference frequency signal; and
    operating the calibrated first circuit in a filter mode.

11. The method of claim 10 wherein the receiving the output frequency signal comprises receiving the output frequency signal from the first circuit operating as an oscillator in the calibration mode.

12. The method of claim 10 wherein the first circuit includes a variable circuit element, the calibrating comprising adjusting the variable circuit element of the first circuit to calibrate the first circuit based on the reference frequency signal and the output frequency signal.

13. The method of claim 10 wherein the calibrating comprises iteratively adjusting the variable circuit element of the first circuit based on the reference frequency signal and the output frequency signal.

14. The method of claim 10 and further comprising adjusting one or more circuit elements of a second circuit based on the calibration of the first circuit.

15. The method of claim 10 wherein the first circuit includes a variable circuit element, the calibrating comprising adjusting the variable circuit element by providing a digital capacitor control signal to calibrate the first circuit during the calibration mode.

16. The method of claim 15 and further comprising providing the digital capacitor control signal to a second circuit.

17. An apparatus comprising:
    a transconductor-capacitor (Gm-C) circuit adapted to operate as a capacitor controlled oscillator in a calibration mode and as a filter in a filter mode;
    a control circuit adapted to receive an output frequency signal from the Gm-C circuit during the calibration mode and a reference frequency signal, the control circuit adapted to calibrate the gm-C circuit in the calibration mode by adjusting a transconductor or capacitor of the Gm-C circuit based on the output frequency signal and the reference frequency signal, the calibrated Gm-C circuit adapted to operate as a filter in the filter mode.

18. The apparatus of claim 17 wherein the control circuit is adapted to adjust the variable transconductor or capacitor of the gm-C circuit by providing a digital capacitor control signal to calibrate the first circuit during the calibration mode.

* * * * *